United States Patent
Lui

(10) Patent No.: US 9,013,848 B2
(45) Date of Patent: Apr. 21, 2015

(54) ACTIVE CLAMP PROTECTION CIRCUIT FOR POWER SEMICONDUCTOR DEVICE FOR HIGH FREQUENCY SWITCHING

(71) Applicant: Alpha & Omega Semiconductor, Inc., Sunnyvale, CA (US)

(72) Inventor: Sik K. Lui, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 345 days.

(21) Appl. No.: 13/628,602

(22) Filed: Sep. 27, 2012

(65) Prior Publication Data
US 2014/0085760 A1   Mar. 27, 2014

(51) Int. Cl.
*H02H 3/20* (2006.01)
*H03K 17/082* (2006.01)
*H01L 27/02* (2006.01)
*H03K 17/08* (2006.01)

(52) U.S. Cl.
CPC ............ *H03K 17/0822* (2013.01); *H03K 17/08* (2013.01); *H01L 27/0266* (2013.01); *H01L 27/0255* (2013.01)

(58) Field of Classification Search
USPC .................................................. 361/91.5, 91.7
See application file for complete search history.

(56) References Cited

U.S. PATENT DOCUMENTS

| | | | |
|---|---|---|---|
| 4,922,365 A * | 5/1990 | Mori | 361/18 |
| 5,079,608 A | 1/1992 | Wodarczyk et al. | |
| 5,304,802 A * | 4/1994 | Kumagai | 257/328 |
| 5,324,971 A | 6/1994 | Notley | |
| 5,365,099 A | 11/1994 | Phipps et al. | |
| 5,631,187 A * | 5/1997 | Phipps et al. | 438/237 |
| 5,812,006 A * | 9/1998 | Teggatz et al. | 327/309 |
| 8,254,070 B2 * | 8/2012 | Arndt et al. | 361/56 |
| 2006/0006851 A1 * | 1/2006 | Thiery | 323/265 |
| 2010/0232081 A1 * | 9/2010 | Disney | 361/91.5 |
| 2014/0085760 A1 * | 3/2014 | Lui | 361/91.5 |

* cited by examiner

*Primary Examiner* — Ronald W Leja
(74) *Attorney, Agent, or Firm* — Van Pelt, Yi & James LLP

(57) ABSTRACT

A protection circuit for a power transistor includes a first transistor connected in parallel with the power transistor and having a control terminal connected to a first power supply voltage through a first resistive element; and a first set of diodes connected between a first terminal and a control terminal of the first transistor. In operation, the voltage at the first terminal of the first transistor is clamped to a clamp voltage and the first transistor is turned on to conduct current in a forward conduction mode when an over-voltage condition occurs at a first terminal of the power transistor.

22 Claims, 3 Drawing Sheets

ACTIVE CLAMP PROTECTION CIRCUIT FOR POWER SEMICONDUCTOR DEVICE FOR HIGH FREQUENCY SWITCHING

FIELD OF THE INVENTION

The invention relates to protective circuits for power semiconductor devices and, in particular, to an active clamp protection circuit for protecting a power semiconductor device while enabling high frequency switching operation.

DESCRIPTION OF THE RELATED ART

Power transistors, such as power MOSFETs, are often used in applications for switching an inductive load. Such power transistors may include a protection circuit integrated therewith for protecting the transistor against short-circuit events at the load, against drain over-voltage conditions, and against electrostatic discharge (ESD). For a power MOSFET, the protection circuit may also include current limiting elements to protect the transistor from damages caused by operating outside the safe operating area. The protection circuit may further include over-voltage protection circuit at the drain terminal to protect the MOSFET from damages caused by over-voltage transients.

In particular, when the power transistor switches off the inductive load in normal operation, the power transistor must absorb the energy stored in the load inductor. The over-voltage transient that occurs during inductive load switch-off is typically referred to as an Unclamped Inductive Switching (UIS) event for power MOSFET devices. During an UIS event, the power MOSFET is turned off but the drain and source junctions are in avalanche mode and conduct significant amount of current. Without any circuit protection, the parasitic bipolar transistor may turn on and irreversible damages to the transistor device may result.

Protection circuits using active clamping for protecting against over-voltage conditions have been described in U.S. Pat. Nos. 5,079,608, 5,324,971 and 5,365,099. FIG. 1 duplicates FIG. 1 of the '608 patent and illustrates a power MOSFET $Q_2$ connected to an active clamp protection circuit including a diode string of diodes D3 and D4. The power MOSFET Q2 also has resistance $R_{g1}$ and $R_{g2}$ connected between the gate drive node (GATE) and the gate terminal of the MOSFET device. The series resistance of resistances $R_{g1}$ and $R_{g2}$, operate in conjunction with the gate capacitance to reduce the switching speed of power MOSFET transistor $Q_2$, which otherwise is relatively fast. FIG. 2 duplicates FIG. 2 of the '099 patent and illustrates a power MOSFET connected to an active clamp protection circuit including as a diode string formed in a polysilicon to provide a temperature compensated sustaining voltage for the power MOSFET.

In brief, an active clamp protection circuit includes a series connection of one or more pairs of back-to-back diodes connected between the drain and gate terminals of the protected transistor device. In operation, alternate ones of the diodes will be reverse-biased in normal operation of the power transistor and the remaining diodes will be forward-biased. The sum of the reverse and forward voltages of the diode string provides for a clamp voltage at the drain terminal of the power MOSFET that is lower than the avalanche voltage of the power transistor device. The diode string therefore clamps the power transistor's sustaining voltage to the total avalanche voltage of the diode.

During an UIS event when the power transistor is turned off to switch off the inductive load, an over-voltage condition is presented at the drain terminal of the power transistor and the power transistor has to dissipate the inductive fly-back energy. During the UIS event, the reverse-biased diodes in the diode string will break down and the diode string conducts current. Current flow through the diode string will cause the voltage at the gate terminal of the power transistor to rise, there by turning on the power transistor device. As a result, the transistor dissipates the excessive power due to inductive fly-back in the conduction mode with the power transistor being turned on, rather than in the more undesirable avalanche mode when the power transistor is turned off.

When active clamp protection circuit is used, the gate of the protected power transistor device cannot be connected to ground as the transistor device has to be capable of being turned on by the protection circuit. Accordingly, a gate resistor, such as the gate resistance $R_{g1}$ and $R_{g2}$ used in the '608 patent, is often used to allow the gate terminal of the transistor to flow. However, such gate resistance slows down the switching of the transistor device, rendering the device not suitable for high speed switching applications.

SUMMARY OF THE INVENTION

According to one embodiment of the present invention, a protection circuit for a power transistor having a first terminal configured to drive a load, a second terminal coupled to a first power supply voltage, and a control terminal configured to receive a control signal, includes a first transistor having a first terminal coupled to the first terminal of the power transistor, a second terminal coupled to the first power supply voltage, and a control terminal coupled to the first power supply voltage through a first resistive element; and a first set of diodes connected between the first terminal and the control terminal of the first transistor. In operation, a voltage between the first terminal and the control terminal of the first transistor is clamped at a voltage sum of all diode voltages of the first set of diodes, the diode voltages including forward voltage or reverse voltage. The first transistor is turned on to conduct current in a forward conduction mode when an over-voltage condition occurs at the first terminal of the power transistor.

According to another aspect of the present invention, a method of protecting a power transistor having a first terminal configured to drive a load, a second terminal coupled to a first power supply voltage, and a control terminal configured to receive a control signal, includes providing a first transistor connected in parallel with the power transistor and having a control terminal connected to the first power supply voltage through a first resistive element; detecting an over-voltage condition at the first terminal of the power transistor; turning on the first transistor to conduct current in a forward conduction mode when the over-voltage condition is detected; and clamping the voltage at the first terminal of the power transistor to a first clamp voltage.

The present invention is better understood upon consideration of the detailed description below and the accompanying drawings.

DETAILED DESCRIPTION OF THE PREFERRED EMBODIMENTS

In accordance with the principles of the present invention, an active clamp protection circuit for a power transistor switching an inductive load includes a grounded active clamp transistor connected in parallel with the protected power transistor. The active clamp transistor has its gate terminal tied to the ground potential through a resistor so that the active clamp transistor remains turned off during normal operation but is turned on during an Unclamped Inductive Switching (UIS) event to absorb the inductor energy. In this manner, the gate terminal of the protected power transistor can be connected directly to the gate drive signal without intervening gate resistance that may slow down the switching speed of the power transistor.

Figure 1:
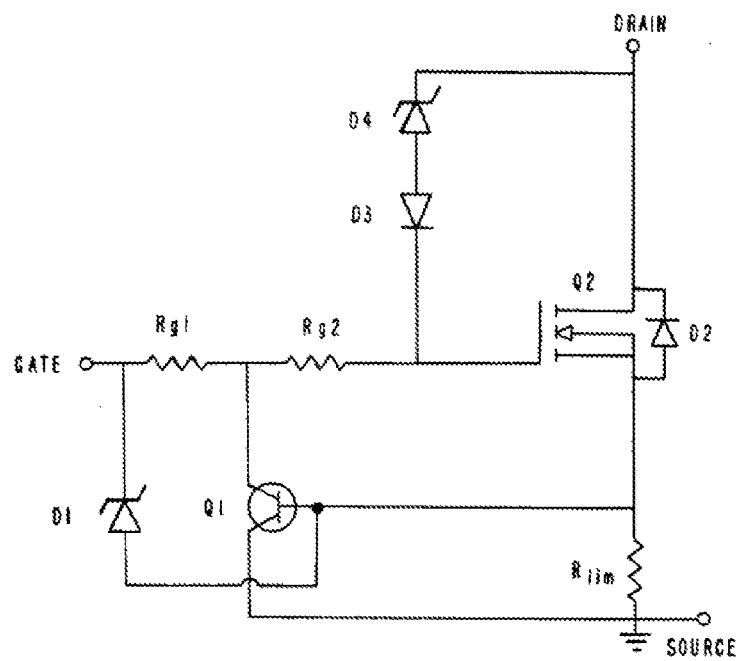
FIG. 1 duplicates FIG. 1 of U.S. Pat. No. 5,079,608 and illustrates a power MOSFET $Q_2$ connected to an active clamp protection circuit.
Figure 2:
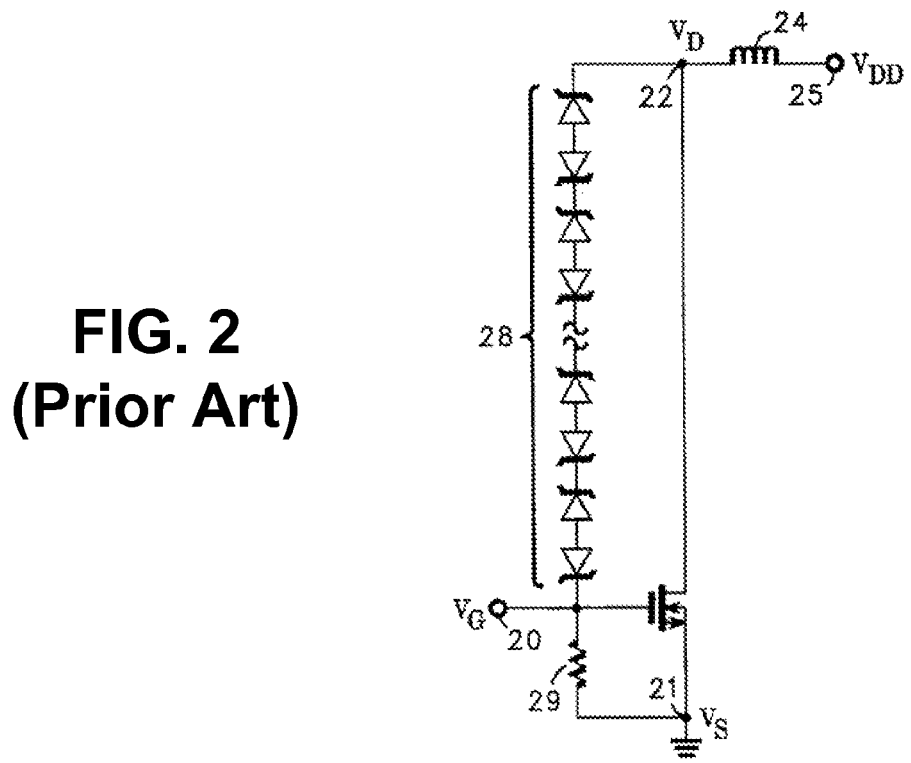
FIG. 2 duplicates FIG. 2 of U.S. Pat. No. 5,365,099 and illustrates a power MOSFET connected to an active clamp protection circuit.
Figure 3:
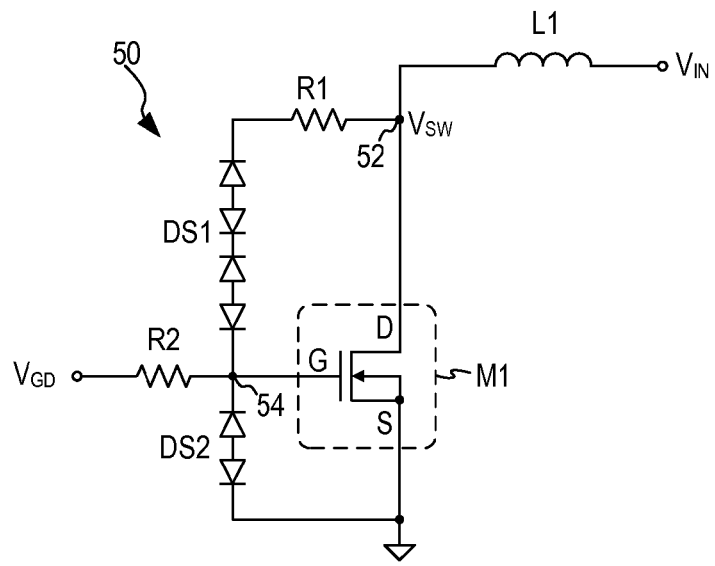
FIG. 3 is a circuit diagram illustrating a typical active clamp protection circuit as applied to protect a power transistor.

FIG. 3 is a circuit diagram illustrating a typical active clamp protection circuit as applied to protect a power transistor. Referring to FIG. 3, a power transistor M1, which is a MOSFET in the present illustration, is configured to switch an inductive load, shown as an inductor L1 connected to an input voltage $V_{IN}$. The power transistor M1 is driven by a gate drive signal $V_{GD}$. The power transistor M1 is protected by an active clamp protection circuit 50 including a first diode string DS1 connected between the drain terminal (node 52), through a resistor R1, and the gate terminal (node 54) of the transistor M1. The active clamp protection circuit 50 further includes a gate protection diode string DS2 connected between the gate terminal (node 54) and the source terminal of the transistor M1. The source terminal of transistor M1 is connected to the ground potential. A resistor R2 is connected between the gate terminal (node 54) of the transistor M1 and the gate drive signal $V_{GD}$.

In operation, the resistor R1 limit the diode breakdown current through the diode string DS1 while the resistor R2 allows the gate terminal of the transistor M1 to float so that the transistor can be turned on by the current through the diode string during an over-voltage event to conduct the current through forward conduction of the power transistor M1 instead of avalanche conduction at the drain/source junctions. However, the resistance R2 at the gate terminal of the power transistor M1 slows down the switching operation of the transistor, rendering the protected power transistor M1 not suitable for high speed applications. Also, the diode string DS2 forms a leakage current path to ground.

Figure 4:
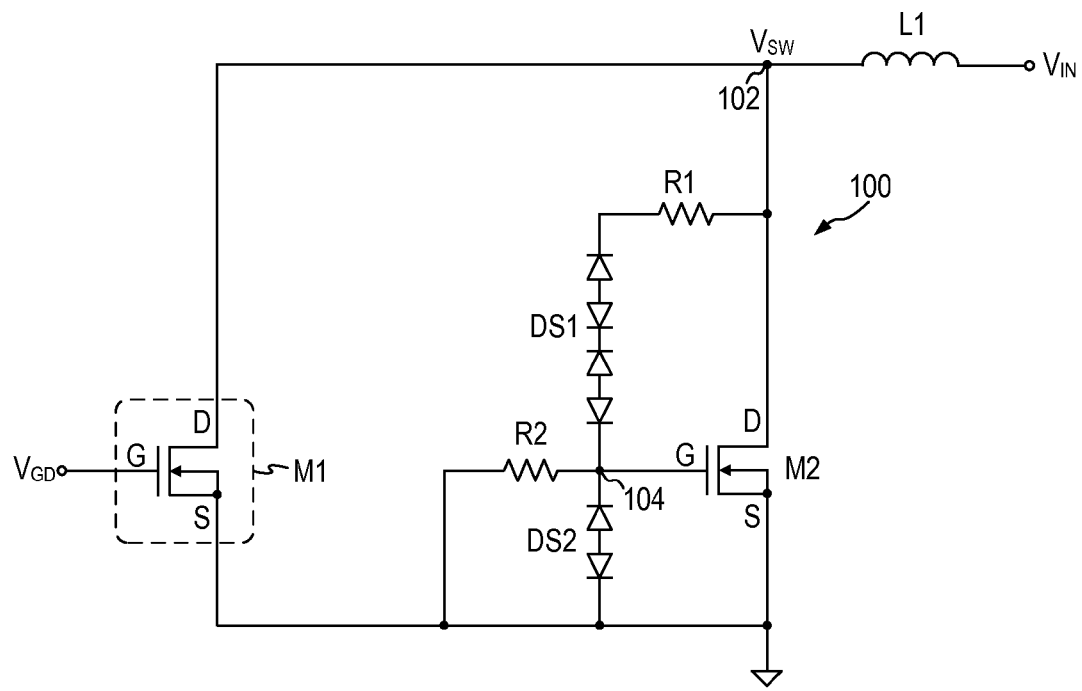
FIG. 4 is a circuit diagram illustrating an active clamp protection circuit applied to protect a power transistor according to one embodiment of the present invention.

According to embodiments of the present invention, an active clamp protection circuit for a power transistor switching an inductive load includes a grounded active clamp transistor connected in parallel with the protected power transistor. FIG. 4 is a circuit diagram illustrating an active clamp protection circuit applied to protect a power transistor according to one embodiment of the present invention. Referring to FIG. 4, a power transistor M1, which is a MOSFET in the present embodiment, is controlled by a gate drive signal $V_{GD}$ and is coupled to drive a load. In the present illustration, the power transistor M1 is configured to switch an inductive load, shown as an inductor L1 connected to an input voltage $V_{IN}$. The drain terminal (node 102) of the power transistor M1 is connected to the inductor L1. The source terminal of the power transistor M1 is connected to the ground potential. The power transistor M1 receives the gate drive signal $V_{GD}$ to switch the inductive load on and off. When the power transistor M1 is turned off, inductive fly-back energy from the inductive load L1 may cause the voltage at the drain terminal (node 102) of the power transistor M1 to increase rapidly, resulting in over-voltage transients at the drain node.

The power transistor M1 is protected from over-voltage transient events by an active clamp protection circuit 100 which includes a grounded active clamp transistor M2 connected in parallel with the protected power transistor M1. In the following description, the grounded active clamp transistor M2 will be referred to as the "clamped transistor" while the power transistor M1 for switching the inductive load will be referred to as the "protected transistor" or the "switching transistor."

More specifically, the active clamp protection circuit 100 includes the clamped transistor M2 having a drain terminal connected to the drain terminal (node 102) of the protected transistor M1, a gate terminal that is connected to the ground potential through a resistor R2, and a source terminal connected to ground. In other embodiments, a current limiting resistor may be included at the source terminal of transistor M2. The active clamp protection circuit 100 further includes a first diode string DS1 and a resistor R1 connected between the drain terminal (node 102) and the gate terminal (node 104) of the clamped transistor M2. The active clamp protection circuit 100 may further include a second diode string DS2 connected between the gate terminal (node 104) of the clamped transistor M2 and the ground potential for gate protection. In the present embodiment, diode string DS1 includes one or more pairs of back-to-back connected diodes. Diode string DS2 typically includes one pair of back-to-back connected diodes but may also include two or more pairs of back-to-back connected diodes.

As thus configured, the resistor R1 limits the diode breakdown current flowing through the diode string DS1 while the resistor R2 allows the gate terminal of the clamped transistor M2 to float so that the transistor can be turned on when sufficient current flows in the diode string DS1 during an over-voltage event. Furthermore, alternate ones of the diodes in the diode string DS1 will be reverse-biased in normal operation of the power transistor M1 and the remaining diodes will be forward-biased. The sum of the reverse and forward voltages of the diode string DS1 together with the turn-on voltage of clamped transistor M2 provides for a clamp voltage at the drain terminal of transistor M2 that is lower than the avalanche breakdown voltage of the clamped transistor M2 and the protected transistor M1. In other words, the drain-to-gate voltage of the clamped transistor M2 is clamped to the sum of the reverse and forward voltages of the diode string DS1. Similarly, alternate ones of the diodes in the gate protection diode string DS2 will be reverse-biased in normal operation of the power transistor M1 and the remaining diodes will be forward-biased. The sum of the reverse and forward voltages of the diode string DS2 provides for a clamping voltage lower than the gate oxide breakdown voltage of the clamped transistor M2 and the protected transistor M1. That is, the gate terminal of the clamped transistor M2 is clamped to the sum of the reverse and forward voltages of the diode string DS2.

In operation, during an UIS event when the power transistor M1 is turned off to switch off the inductive load, an over-voltage condition is presented at the drain terminal (node 102) of the power transistor M1 and also at the drain terminal of the clamped transistor M2. During the UIS event, the reverse-biased diodes in the diode string DS1 will break down and the diode string DS1 conducts current. Current flowing through the diode string DS1 will cause the voltage at the gate terminal of the clamped transistor M2 to rise, thereby turning on the clamped transistor M2 to conduct current through forward conduction of the transistor M2. Meanwhile, the protected transistor M1 remains turned off. As a result, the clamped transistor M2 dissipates the excessive power due to inductive fly-back in the forward conduction mode with the clamped transistor being turned on, rather than in the more undesirable avalanche conduction mode at the drain junction with the power transistor or the clamped transistor being turned off.

In embodiments of the present invention, the diodes in diode strings DS1 and DS2 are and the resistors R1 and R2 are formed in the polysilicon layer of an integrated circuit on which the clamped transistor and/or the switching transistor is formed.

In some embodiments, the gate protection diode string DS2 may be omitted and other methods for protecting the gate terminal of the power transistor may be used. Furthermore, in some embodiments, resistor R1 for limiting the diode breakdown current through the diode string DS1 may also be omitted and the diode string DS1 may be connected directly between the drain and gate terminals of the clamped transistor M2.

The power transistor may be a MOSFET device, a bipolar device or an IGBT transistor. In embodiments of the present invention, the clamped transistor can be constructed as a MOSFET transistor or a bipolar transistor or an insulated gate bipolar transistor (IGBT). Typically, the clamped transistor mirrors the power transistor to be protected. That is, the clamped transistor is formed using the same type of transistor device as the power transistor. In general, the power transistor and the clamped transistor have a first terminal and a second terminal which can be the drain/source terminals or the emitter/collector terminals and have a control terminal which can be the gate terminal or the base terminal.

As thus configured, the active clamp protection circuit 100 is operative to draw current away from the protected power transistor M1 through forward conduction of a parallely connected transistor. The active clamp protection circuit 100 provides many advantages over conventional protection circuits. First, the active clamp protection circuit of the present invention can be readily implemented using conventional MOSFET fabrication technology and does not require special processing steps. Second, the active clamp protection circuit 100 enables high frequency operation at the power transistor because the power transistor does not need to use added gate resistance. Third, the active clamp protection circuit 100 also realizes lower gate leakage current as no diode string is connected to the gate terminal of the switching power transistor. Lastly, the active clamp protection circuit 100 enables efficient use of silicon real estate because the clamped transistor can be independently optimized for forward conduction. Source ballasting can also be added to the active clamp protection circuit without affecting the protected transistor device M1. That is, a current limit resistor can be added between the source terminal and the ground potential of the clamped transistor M2 instead of being added to the protected transistor device M1 in conventional protection schemes. Alternately, the clamped transistor can be configured to carry a large current density, such as by using a distributed layout, as will be described in more detail below.

Figure 5:
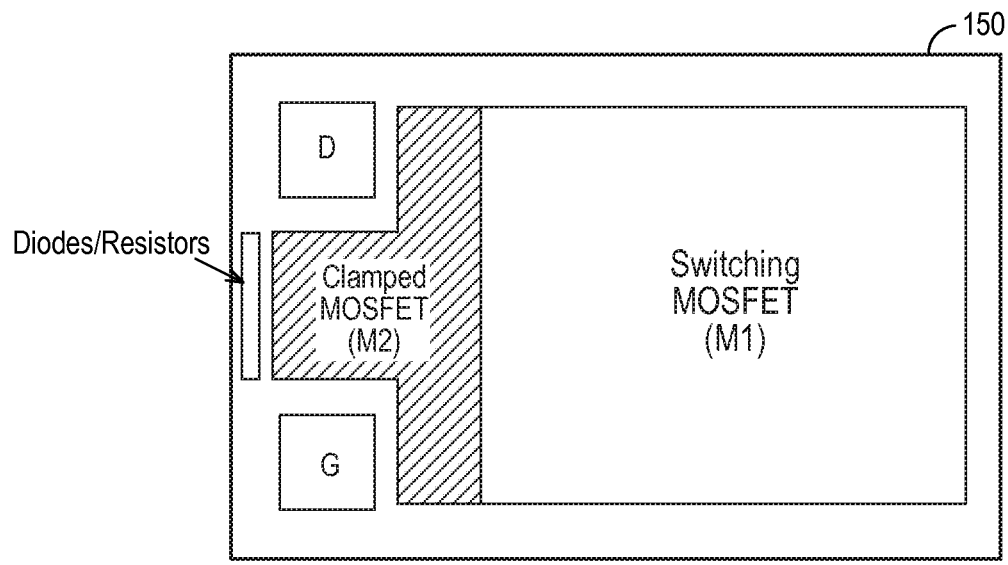
FIG. 5 is a top view of an integrated circuit having a clamped transistor and a power transistor formed thereon according to one embodiment of the present invention.

In embodiments of the present invention, the clamped transistor is formed integrated with the protected switching transistor on the same integrated circuit. FIG. 5 is a top view of an integrated circuit having a clamped transistor and a power transistor formed thereon according to one embodiment of the present invention. Referring to FIG. 5, an integrated circuit 150 includes a switching transistor (i.e., the protected power transistor) and a clamped transistor, both MOSFET devices, formed thereon. In the present embodiment, the clamped MOSFET M2 and the switching MOSFET M1 are formed as segregated device structures, that is, the MOSFETs are formed in separate regions of the integrated circuit. In the present embodiment, the diodes and resistors are also formed on the integrated circuit and electrically connected to the clamped MOSFET.

Figure 6:
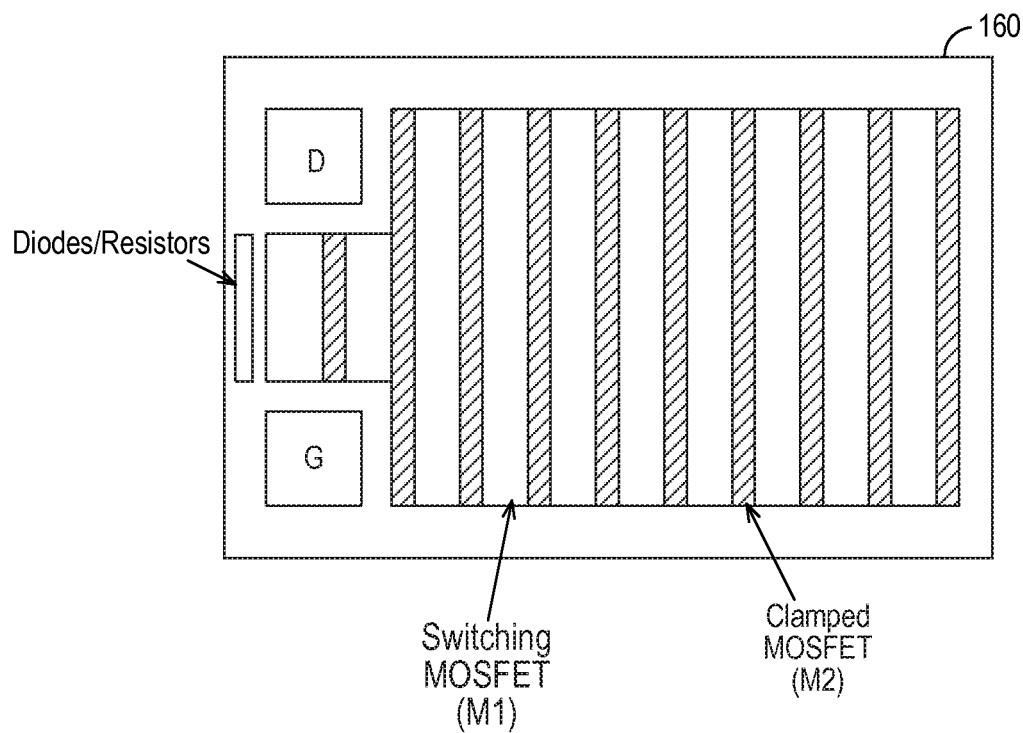
FIG. 6 is a top view of an integrated circuit having a clamped transistor and a power transistor formed thereon according to an alternate embodiment of the present invention.

FIG. 6 is a top view of an integrated circuit having a clamped transistor and a power transistor formed thereon according to an alternate embodiment of the present invention. Referring to FIG. 6, an integrated circuit 160 includes a switching transistor (i.e., the protected power transistor) and a clamped transistor, both MOSFET devices, formed thereon. In the present embodiment, the clamped MOSFET M2 and the switching MOSFET M1 are formed using a distributed device structure. That is, the MOSFET M1 and the MOSFET M2 are formed with device regions interleaved and distributed through the entire integrated circuit. In the present embodiment, the diodes and resistors are also formed on the integrated circuit and electrically connected to the clamped MOSFET. By forming the clamped MOSFET M2 as distributed structure throughout the integrated circuit, the clamped MOSFET M2 of FIG. 6 has the capability of carrying a large current density. In the embodiment shown in FIG. 6, the switching MOSFET and the clamped MOSFET are formed in a stripped pattern. In other embodiments, the two MOSFETs can be formed using other geometric patterns, such as squares, circles or a honeycomb pattern.

In embodiments of the present invention, the MOSFETs in FIGS. 5 and 6 are formed using a bottom drain electrode. A drain pad is provided on the top surface of the integrated circuits 150 and 160 to connect to the diodes and resistors formed on the top side of the integrated circuits. The drain pad is then down-bond to the die paddle to be electrically connected to the common drain terminal of the transistors.

In another embodiment, a connection to the drain is provided on the top surface of the integrated circuits to connect the diodes and resistors to the common drain of the transistors.

In some embodiments, the clamped transistor and the power transistor are formed integrated on the same integrated circuit while the resistors and diodes are formed on a separate integrated circuit and electrically connected to the transistor integrated circuit.

In other embodiments, the clamped transistor and the power transistor are discrete devices and in some embodiments, the two discrete transistors may be co-packaged into the same integrated circuit packages. When the clamped transistor is formed as a discrete device, the resistors and diodes may also be discrete devices.

In the above-described embodiments, the diodes in the diode strings DS1 and DS2 are configured as back-to-back diodes. That is, the diode string includes a forward-biased diode and a reverse-biased diode connected together as a pair where the anode terminals or the cathode terminals of a diode pair are connected together. Forming back-to-back diodes has the advantage of ease of implementation as the back-to-back diodes can be formed as adjacent P-type and N-type doped regions in polysilicon or in the silicon substrate. However, the use of back-to-back diodes is illustrative only and is not intended to be limiting. In other embodiments, the diodes in the diode string DS1 or DS2 may be arranged in other configurations and the exact arrangement of the forward biased and reverse biased diodes in the diode string is not critical to the practice of the present invention. Furthermore, because the diode string DS1 or DS2 are not connected to the switching transistor but rather to a "dummy" transistor provided for protection purpose only, the diode string DS1 or DS2 may be formed using only forward biased diodes, or only reverse biased diodes, or any combination of forward and reverse biased diodes. In embodiments of the present invention, the combination of forward and reverse biased diodes may be arranged in any order, including alternately arranged forward and reverse biased diodes or other arrangements. For example, two forward biased diodes may be connected in series to two reverse biased diodes to form a diode string. As thus constructed, the drain-to-gate voltage of the clamped transistor is clamped to the sum of all diode voltages of the diodes in the diode string DS1 where the diode voltages include forward voltages or reverse voltages of the diodes. Similarly, the gate voltage of the clamped transistor is clamped to the sum of all diode voltages of the diodes in the diode string DS2 where the diode voltages include forward voltages or reverse voltages of the diodes.

The above detailed descriptions are provided to illustrate specific embodiments of the present invention and are not intended to be limiting. Numerous modifications and variations within the scope of the present invention are possible. The present invention is defined by the appended claims.

I claim:

1. A protection circuit for a power transistor, the power transistor including a first terminal configured to drive a load, a second terminal coupled to a first power supply voltage, and a control terminal configured to receive a control signal, the protection circuit comprising:
   a first transistor having a first terminal coupled to the first terminal of the power transistor, a second terminal coupled to the first power supply voltage, and a control terminal coupled to the first power supply voltage through a first resistive element, wherein the control terminal of the first transistor does not receive the control signal driving the power transistor; and
   a first plurality of diodes connected between the first terminal and the control terminal of the first transistor, wherein a voltage between the first terminal and the control terminal of the first transistor is clamped at a voltage sum of all diode voltages of the first plurality of diodes, the diode voltages comprising forward voltage or reverse voltage,
   wherein the first transistor is a dummy transistor and is normally turned off by having the control terminal connected to the first power supply voltage through the first resistive element, the first transistor is turned on to conduct current in a forward conduction mode in response to an over-voltage event occurring at the first terminal of the power transistor, the first transistor being turned on by a current flowing through the first plurality of diodes to the control terminal of the first transistor during the over-voltage event.

2. The protection circuit of claim 1, wherein the power transistor remains turned off during the over-voltage event.

3. The protection circuit of claim 1, wherein a voltage at the first terminal of the power transistor is clamped to a clamp voltage being the voltage sum of the diode voltages of the first plurality of diodes and a turn-on voltage of the first transistor, the diode voltages comprising forward voltage or reverse voltage.

4. The protection circuit of claim 1, further comprising:
   a second resistive element connected in series to the first plurality of diodes between the first terminal and the control terminal of the first transistor, wherein the second resistive element limits the current flowing through the first plurality of diodes.

5. The protection circuit of claim 1, further comprising:
   a second plurality of diodes connected between the control terminal and the second terminal of the first transistor, wherein a voltage at the control terminal of the first transistor is clamped at a voltage sum of all diode voltages of the second plurality of diodes, the diode voltages comprising forward voltage or reverse voltage.

6. The protection circuit of claim 1, wherein the first transistor comprises one of a MOSFET device, a bipolar transistor device, or an insulated gate bipolar transistor (IGBT).

7. The protection circuit of claim 1, wherein the first plurality of diodes comprises one or more pairs of back-to-back connected diodes.

8. The protection circuit of claim 5, wherein the second plurality of diodes comprises one or more pairs of back-to-back connected diodes.

9. The protection circuit of claim 1, wherein the first plurality of diodes and the first resistive element are formed in a polysilicon layer of an integrated circuit on which the protection circuit is formed.

10. The protection circuit of claim 1, wherein the power transistor and the first transistor are formed as discrete transistor devices.

11. The protection circuit of claim 1, wherein the power transistor and the first transistor are formed integrated on the same integrated circuit.

12. The protection circuit of claim 11, wherein the first transistor is being optimized differently from the power transistor.

13. The protection circuit of claim 11, wherein the power transistor and the first transistor are formed in separate areas of the integrated circuit.

14. The protection circuit of claim 11, wherein the power transistor and the first transistor are formed interleaved and distributed over the entire area of the integrated circuit.

15. A method of protecting a power transistor, the power transistor including a first terminal configured to drive a load, a second terminal coupled to a first power supply voltage, and a control terminal configured to receive a control signal, the method comprising:
   providing a first transistor connected in parallel with the power transistor and having a control terminal connected to the first power supply voltage through a first resistive element, wherein the control terminal of the first transistor does not receive the control signal driving the power transistor and the first transistor is a dummy transistor and is normally turned off by having the control terminal connected to the first power supply voltage through the first resistive element;
   detecting an over-voltage event at the first terminal of the power transistor;
   turning on the first transistor to conduct current in a forward conduction mode in response to the over-voltage event being detected, the first transistor being turned on by a current flowing to the control terminal of the first transistor during the over-voltage event; and
   clamping the voltage at the first terminal of the power transistor to a first clamp voltage.

16. The method of claim 15, wherein the power transistor remains turned off during the over-voltage condition.

17. The method of claim 15, wherein providing a first transistor connected in parallel with the power transistor comprises:
  providing the first transistor having a first terminal coupled to the first terminal of the power transistor, a second terminal coupled to the first power supply voltage, and the control terminal coupled to the first power supply voltage through the first resistive element.

18. The method of claim 17, wherein turning on the first transistor and clamping the voltage at the first terminal of the power transistor comprises:
  providing a first plurality of diodes connected between the first terminal and the control terminal of the first transistor, wherein the voltage between the first terminal and the control terminal of the first transistor is clamped at a voltage sum of all diode voltages of the first plurality of diodes, the diode voltages comprising forward voltage or reverse voltage,
  wherein the first terminal of the power transistor is clamped to the first clamp voltage being the voltage sum of the diode voltages of the first plurality of diodes and a turn-on voltage of the first transistor, the diode voltages comprising forward voltage or reverse voltage; and
  wherein the first transistor is turned on by a current flowing through the first plurality of diodes to the control terminal of the first transistor during the over-voltage event.

19. The method of claim 18, further comprising:
  limiting the current flowing through the first plurality of diodes.

20. The method of claim 18, wherein the first plurality of diodes comprises one or more pairs of back-to-back connected diodes.

21. The method of claim 15, further comprising:
  clamping the voltage at the control terminal of the first transistor to a second clamp voltage.

22. The method of claim 15, wherein the first transistor comprises one of a MOSFET device, a bipolar transistor device, or an insulated gate bipolar transistor (IGBT).

* * * * *